(12) United States Patent
Wahl et al.

(10) Patent No.: US 8,754,468 B2
(45) Date of Patent: Jun. 17, 2014

(54) POWER SEMICONDUCTOR COMPONENT WITH PLATE CAPACITOR STRUCTURE HAVING AN EDGE PLATE ELECTRICALLY CONNECTED TO SOURCE OR DRAIN POTENTIAL

(76) Inventors: Uwe Wahl, Munich (DE); Armin Willmeroth, Augsburg (DE)

(*) Notice: Subject to any disclaimer, the term of this patent is extended or adjusted under 35 U.S.C. 154(b) by 74 days.

(21) Appl. No.: 12/962,791

(22) Filed: Dec. 8, 2010

(65) Prior Publication Data

US 2011/0115007 A1     May 19, 2011

Related U.S. Application Data

(62) Division of application No. 11/382,838, filed on May 11, 2006, now Pat. No. 7,872,300.

(30) Foreign Application Priority Data

May 13, 2005   (DE) .......................... 10 2005 023 026

(51) Int. Cl.
 *H01L 29/76*   (2006.01)
 *H01L 29/40*   (2006.01)
(52) U.S. Cl.
 CPC .................................... *H01L 29/402* (2013.01)
 USPC ................................... 257/328; 257/E29.009

(58) Field of Classification Search
 CPC ............. H01L 29/402; H01L 29/7811; H01L 29/7827
 See application file for complete search history.

(56) References Cited

U.S. PATENT DOCUMENTS

| | | | | |
|---|---|---|---|---|
| 4,614,959 A * | 9/1986 | Nakagawa | ..................... | 257/409 |
| 5,430,324 A * | 7/1995 | Bencuya | ........................ | 257/495 |
| 6,100,572 A * | 8/2000 | Kinzer | .......................... | 257/492 |
| 2002/0063281 A1* | 5/2002 | Tihanyi | ......................... | 257/328 |
| 2003/0222327 A1* | 12/2003 | Yamaguchi et al. | .......... | 257/500 |
| 2004/0099923 A1* | 5/2004 | Tihanyi | ......................... | 257/500 |

* cited by examiner

*Primary Examiner* — Wael Fahmy
*Assistant Examiner* — Sarah Salerno
(74) *Attorney, Agent, or Firm* — Murphy, Bilak & Homiller, PLLC

(57) ABSTRACT

A lateral power semiconductor component has a front side, a rear side and a lateral edge. The component further includes a drift zone of a first conductivity type, a source zone of the first conductivity type, a body zone of a second conductivity type opposite the first conductivity type, and a drain zone of the first conductivity type. A gate forms a MOS structure with the drift zone, the source zone and the body zone. A horizontally extending field plate above each semiconductor region of the power semiconductor component forms a plate capacitor structure with an edge plate lying under the field plate. The edge plate includes a highly doped semiconductor material and is electrically connected to one of a source potential and a drain potential of the power semiconductor component.

15 Claims, 8 Drawing Sheets

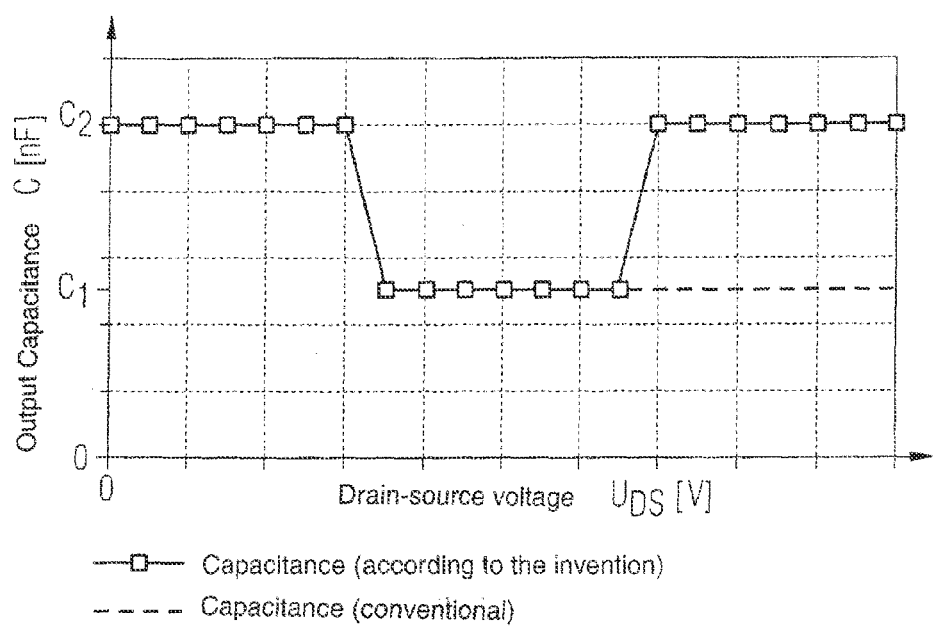
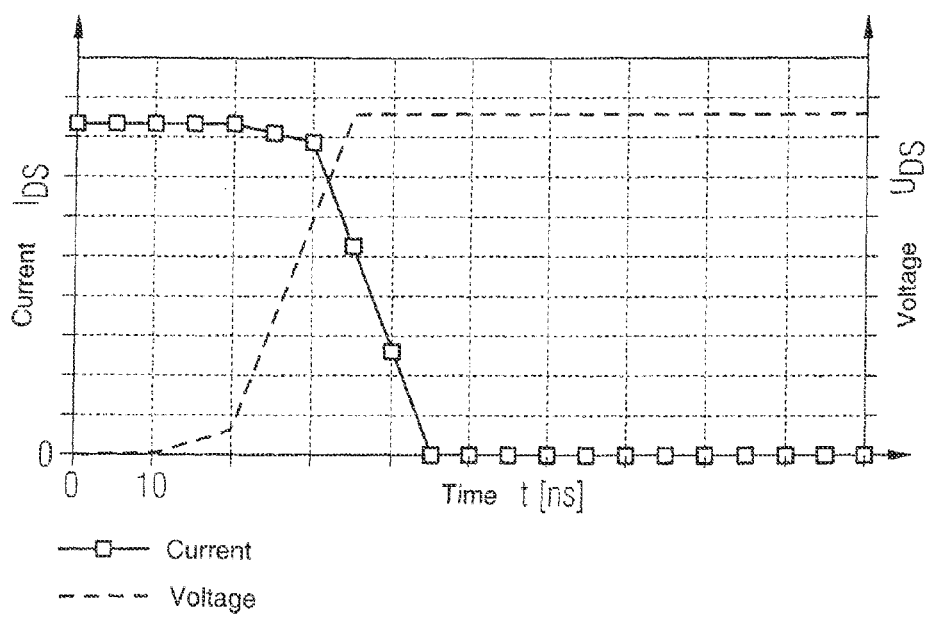

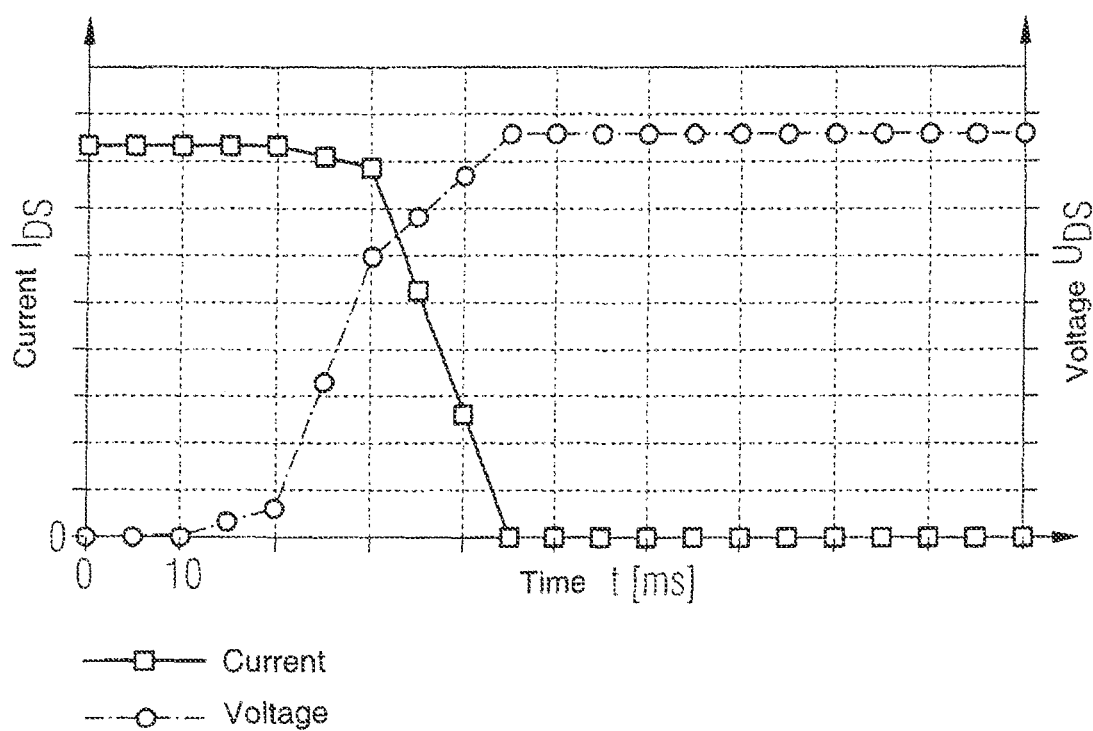

POWER SEMICONDUCTOR COMPONENT WITH PLATE CAPACITOR STRUCTURE HAVING AN EDGE PLATE ELECTRICALLY CONNECTED TO SOURCE OR DRAIN POTENTIAL

PRIORITY

This application is a divisional of U.S. patent application Ser. No. 11/382,838 filed 11 May 2006, which claims priority from German Patent Application No. DE 10 2005 023 026.1 filed 13 May 2005, both of said applications incorporated herein by reference in their entirety.

TECHNICAL FIELD

The invention relates to power semiconductor components having a front side, a rear side and a lateral edge.

BACKGROUND

A power semiconductor component is formed for example as a vertical power transistor with compensation pillars. Such a power semiconductor component contains a semiconductor body having at least one drift zone of the first conductivity type, a multiplicity of source zones of the first conductivity type, a drain zone of the first conductivity type and a multiplicity of body zones of the second conductivity type.

Such a vertical power transistor furthermore contains at least one gate which forms a MOS structure with a drift zone, a source zone and with a body zone. It contains compensation pillars of the second conductivity type which are in electrical contact with the source zones and which project into the drift zone from above. An edge termination is situated between the edge and the MOS structure. The edge is at the same potential as the drift zone, so that the edge termination reduces voltage between the edge and the source zones. Such a vertical power transistor is known for example from U.S. Pat. No. 6,630,698.

A power semiconductor component may also be fashioned with field rings as a vertical power semiconductor component. Such a component contains a semiconductor body having at least one drift zone of the first conductivity type, a multiplicity of source zones of the first conductivity type, a multiplicity of body zones of the second conductivity type and a drain zone of the first conductivity type. The vertical power semiconductor component furthermore contains at least one gate which forms a MOS structure with a drift zone, a source zone and with a body zone. An edge termination having a multiplicity of field rings of the second conductivity type is situated between the edge and the MOS structure. The field rings enclose MOS structures. The edge is at the same potential as the drift zone, so that the edge termination reduces voltage between the edge and the source zone. Field rings are known for example from U.S. Pat. No. 4,750,028.

A power semiconductor component may also be formed as a lateral power semiconductor component having a front side, a rear side, and a lateral edge. It contains on its front side at least one drift zone, a source zone and a drain zone, which are of the first conductivity type, and at least one body zone of the second conductivity type. A gate is provided at the front side and forms a MOS structure with a drift zone, a source zone and a body zone. Such a lateral power semiconductor component is shown in U.S. Pat. No. 4,750,028.

Power semiconductor components are used inter alia for clocked switched-mode power supplies. Modern power semiconductor components enable switching frequencies in the high kHz range (60 kHz or more).

This leads on the one hand to a significant reduction of the structural volume of the switched-mode power supply, but on the other hand also to increased radiofrequency interference disturbances. In order to prevent such radio frequency interference disturbances from being coupled into the supply voltage network, minimum requirements are made of the electromagnetic compatibility (EMC) of power supplies. The radiofrequency interference disturbances that occur therefore can be filtered with a high outlay.

In this case, so-called power factor correctors can be used, which are also known as power factor controlling (PFC). They are formed either as active PFC circuits or as passive PFC circuits, depending on whether active or passive components are used.

In the case of passive PFC circuits, expensive filter components such as capacitors and inductors are generally used in order to comply with the corresponding standards for electromagnetic compatibility (EMC).

Active PFC circuits are generally integrated circuits (ICs) containing active components such as transistors and diodes. There are active PFC circuits which are integrated together with a power semiconductor component on a single IC. The active PFC circuits are accordingly complicated to produce and may require a space within the switched-mode power supply, which increases the overall costs for the power supply.

SUMMARY

In an embodiment, a vertical power semiconductor component may comprise field rings. Such a component may comprise a front side, a rear side and/or a lateral edge. It may comprise a semiconductor body comprising, e.g., a drift zone of a first conductivity type, a multiplicity of source zones of the first conductivity type, a multiplicity of body zones of a second conductivity type, and/or a drain zone.

It additionally may comprise at least one gate which forms a MOS structure comprising, e.g., a drift zone, at least one source zone and/or at least one body zone. The vertical semiconductor component may be formed as a power MOSFET if, e.g., the drain zone is of a first conductivity type. If, by contrast, the drain zone is of a second conductivity, an IGBT (insulated gate bipolar transistor) may result.

The source zone, the body zone and the gates may be situated at the front side of the power semiconductor component, while the drain zone may be provided at the rear side. The drift zone, e.g., may extend perpendicularly from the front side to the rear side of the power semiconductor component.

Situated between the edge and the MOS structure may be an edge termination having a multiplicity of field rings of the second conductivity type. The field rings may enclose the MOS structures in that they form rings around the MOS structures on the front side of the power semiconductor component. The semiconductor regions of the edge can be at the same potential as the drift zone. The edge termination may serve for reducing the voltage between the semiconductor regions of the edge and those of the source zone. On the front side of the power semiconductor component, a horizontally extending edge plate can be situated between the edge and the edge termination. Said edge plate can be at the same potential as the drift zone.

A field plate may lie above the edge plate, the edge plate and the field plate forming a plate capacitor structure. The plate capacitor structure may advantageously increase the output capacitance. As a result, the rise in the drain-source voltage may be retarded and the interference disturbances caused by the switching of the power semiconductor component may be reduced. Less complicated PFC circuits can be used for the switched-mode power supplies. This may reduce the circuit complexity for the PFC circuit and the clocked switched-mode power supplies. Hitherto unused regions of the vertical power semiconductor component can be advantageously used for the plate capacitor structure.

If the field plate is connected to a potential that lies between the value of the source potential and the value of the drain potential and is tapped off in the edge termination, the capacitance of the capacitor structure may have an effect only when the power semiconductor component is switched off. The rise in the drain-source voltage may initially take place rapidly and slow down toward the end of the switch-off operation. The time for turning off the power semiconductor component thus may remain short overall and the radiofrequency interference disturbances, which occur only toward the end of the switch-off operation, can nevertheless be reduced. If the field plate is connected to a field ring of the edge termination, the field plate can be put at a potential having a different voltage than the voltage of the edge plate. In this case, it can be advantageous that no additional circuits are necessary to connect the field plate to a potential that differs from the potential of the edge plate.

In this context, edge or lateral edge is also understood to mean a region which does not lie on the exterior of a power semiconductor component but which is separated from all the MOS structures by edge terminations. Even in those regions which may also lie in the center of the chip it can be possible to provide plate capacitor structures by means of field plates and edge plates.

In a further embodiment, an upper conductive layer can be provided above the field plate. Said layer can be insulated from the field plate by means of an insulation layer and can be electrically connected to the drain electrode. The capacitance of the plate capacitor structure can be increased by virtue of this additional layer. Given the same thickness and the same material of the insulation layers, the capacitance can be doubled in comparison with a plate capacitor structure without an upper conductive layer.

If the upper conductive layer comprises metal or metal alloys, the resistance of the upper conductive layer can be low. This reduces the time constant of the plate capacitor structure, as a result of which the plate capacitor structure can be switched on particularly rapidly.

In a further embodiment, the field plate can be connected to a field ring in the center of the edge termination. In the off-state case, the field plate can thus be at a potential between the source potential and the drain potential. A field ring lies in the center of the edge termination if in each case approximately the same number of field rings is provided between it and the edge and also between it and the MOS structures.

In another embodiment, a vertical power semiconductor component may comprise compensation pillars. It may comprise a front side, a rear side and a lateral edge. Here and hereinafter the front side of the component is assumed to be situated at the top and its rear side is assumed to be situated at the bottom.

The power semiconductor component may comprise a semiconductor body comprising a drift zone of the first conductivity type, a multiplicity of source zones of the first conductivity type, a multiplicity of body zones of the second conductivity type, and a drain zone.

The source zone, the body zone and the gates can be situated at the front side of the power semiconductor component, while the drain zone can be provided at the rear side. The drift zone may extend perpendicularly from the front side to the rear side of the power semiconductor component.

The conductivity type can be either n if the free charge carriers are electrons in an n-doped region, or p if the holes in p-doped regions constitute the free charge carriers.

Situated on the front side of the power semiconductor component can be at least one gate which forms a MOS structure comprising, e.g., a drift zone, with at least one source zone and at least one body zone. Upon corresponding driving, that is to say upon application of a specific voltage, the gate may provide for a conductive channel within the body zone between a source zone and a drift zone. The vertical power semiconductor component may comprise compensation pillars of the second conductivity type, which are in electrical contact with the source zones. Said compensation pillars may project into the drift zone from above. As soon as the voltage at the gate falls below a specific threshold, the MOS transistor may turn off. A high voltage may be present between the drift zone and the other semiconductor regions. In this case, the compensation pillars can ensure that compensating opposite charges in the compensation pillars are made available to the charge carriers in the drift zone. The vertical power semiconductor component described may form a superjunction MOS transistor.

An edge termination can be situated between the MOS structure and the edge. The edge termination may comprise for example edge termination pillars of a second conductivity type and/or field rings of a second conductivity type. Edge termination pillars can be structures of the second conductivity type which project into the drift zone perpendicularly from above.

The edge of the power semiconductor component can be at the same potential as the drift zone. The edge termination thus may reduce voltage between the edge and the source zones. If the edge termination contains edge termination pillars, the voltage from the edge inwardly from edge termination pillar to edge termination pillar, in which case potential differences may also occur within the pillars.

Situated at the front side of the vertical power semiconductor component can be a horizontally oriented edge plate which is at the same potential as the drift zone. The edge plate typically may comprise a metallic material or a doped semiconductor material. The edge plate may form a plate capacitor structure with a field plate lying above it, said field plate likewise being horizontally oriented. The insulation layer between the field plate and the edge plate is made of silicon dioxide, for example. The capacitance of this plate capacitor structure can be dependent on the area of overlap between field plate and edge plate, on the thickness of the insulation layer between field plate and edge plate, and on the relative permittivity of the insulation layer between the field plate and the edge plate.

The drain-source capacitance can be advantageously increased by virtue of the provision of the plate capacitor structure. The rise in the drain-source voltage can be retarded and the radiofrequency interference disturbance caused by the switching of the power semiconductor component can be drastically reduced. As a result, it is possible to use less complicated PFC circuits for the switched-mode power supplies. This may have the effect of reducing the circuit complexity for the PFC circuit and for the clocked switched-mode power supplies. The structural volume of the switched-mode power supplies can also be reduced.

The plate capacitor structure may extend over regions which are not used for MOS structures. These hitherto unused regions can advantageously be used, by virtue of the provision of the plate capacitor structure, to reduce the radiofrequency interference caused by the power semiconductor component.

The rising edges of the drain voltage can particularly be steep in the case of compensation components. Radiofrequency interference disturbances may occur to an increased extent as a result of the steep rising edges. In the case of compensation components, therefore, the use of the additional plate capacitor structure can particularly be advantageous in order to prevent the occurrence of radiofrequency interference disturbances.

The drain-source capacitance can be referred to hereinafter as the output capacitance. The temporal profile of the drain-source voltage can be set by virtue of the fact that in the off-state case, the field plate is at a potential that lies between the potential of the drift zone and the potential of the source zone. Depending on the desired profile of the drain-source voltage, the field plate may be connected to a potential that is either closer to the potential of the drift zone or closer to the potential of the source zone.

By virtue of the field plate being connected to one of the edge termination pillars of the edge termination, the field plate can be directly connected to a potential having a different voltage than the voltage of the edge plate. In this case, it can be advantageous that no circuitry outlay is required outside the power semiconductor component in order to connect the field plate. Moreover, the field plate can be connected with low resistance in comparison with an external connection. The time constant of the plate capacitor structure can be reduced as a result, so that the plate capacitor structure is switched on more rapidly.

If the edge termination pillar which is connected to the field plate lies in the center of the edge termination, then in the off-state case, the field plate can be at the potential whose value lies between the value of the source potential and the value of the drain potential.

If the field plate is connected to a potential whose value lies between the value of the source potential and the value of the drain potential, the capacitance of the capacitor structure may have an effect only when the power semiconductor component is switched off. The rise in the drain-source voltage may initially take place rapidly and slow down toward the end of the switch-off operation.

Such a profile of the drain-source voltage can be desired especially as the radiofrequency interference disturbances occur principally at the end of the switch-off operation and a retardation of the rise can be necessary only at the end of the switch-off operation. The time required overall for turning off the power semiconductor component still may remain short in the case of the specified voltage profile and the radio frequency interference disturbances are nevertheless reduced.

In a further embodiment, an upper conductive layer can be provided above the field plate. Said layer can be insulated from the field plate by means of an insulation layer and can be electrically connected to the drain electrode. The capacitance of the plate capacitor structure can be increased by virtue of this additional layer. Given the same thickness and the same material of the insulation layers, the capacitance can be doubled in comparison with a plate capacitor structure without an upper conductive layer.

The capacitance of the field plate can be increased by using a material having a higher relative permittivity than $SiO_2$. In this case, such a material can be used for the insulation layer between the edge plate and the field plate and/or for the insulation layer between the field plate and the overlying upper layer. Examples of materials having a high relative permittivity can be $Si_3N_4$, $TiO_2$, $HfO_2$, $Ta_2O_5$, $Al_2O_3$ and AlN.

If the upper conductive layer comprises metal or metal alloys, the resistance of the upper conductive layer can be low. As a result, the time constant of the plate capacitor structure is reduced, said structure thus can be rapidly switched off and on.

In a further embodiment, the field plate may comprise doped polysilicon. This may have the advantage that in the fabrication of the power semiconductor component, the field plate can be produced at the same time as the gates by means of the same process steps. The fabrication complexity can thereby be reduced.

If the edge plate comprises a semiconductor material and is of the same conductivity type as the semiconductor material surrounding it and is doped more highly than the semiconductor material surrounding it, it may not be depleted in the off-state case. As a result, enough free charge carriers may be still available to form a capacitor together with the field plate. The use of the semiconductor material for the edge plate obviates an additional connection for the edge plate because it may be at the same potential as the semiconductor material surrounding it and may be thus already connected.

The edge plate may form, at the edge of the component, the connection of the semiconductor regions toward the top if there are no lightly doped semiconductor regions situated between the edge plate and the insulation layer lying above it. As a result, the distance between the plates of the plate capacitor structure can be reduced, whereby the capacitance per area can be increased.

If the field plate partly lies above a region with edge termination pillars or field rings of the edge termination, this region of the edge termination can also be concomitantly used for increasing the capacitance of the capacitor structure. In this region, although no contribution may be made to the capacitance by the mutually opposite plates edge plate and field plate, because the edge plate does not extend into this region, in this region the capacitance can be nonetheless increased by the field plate and the upper conductive layer lying above it.

In another embodiment, a lateral power semiconductor component may comprise a front side, a rear side and a lateral edge. It may comprise on a front side at least one drift zone, a source zone and a drain zone of the first conductivity type and also a body zone of the second conductivity type. At least one gate may form a MOS structure with a drift zone, a source zone and a body zone.

Above semiconductor regions of the lateral power semiconductor component, a field plate extends horizontally in some regions of the power semiconductor component. Said field plate may form a plate capacitor structure with an edge plate which lies under the field plate and may comprise a highly doped semiconductor material. In this case, the edge plate can be connected either to the source potential or to the drain potential.

The plate capacitor structure may increase the output capacitance, as a result of which the drain-source voltage rises more slowly, and the radiofrequency interference disturbances generated during the switching of a lateral power semiconductor component may be reduced. In switched-mode power supplies, it is thus possible to use less complicated PFC circuits, which reduces the circuit complexity for the PFC circuits used and the switched-mode power supplies. The structural volume of the switched-mode power supplies can also be reduced as a result. In this case, the plate capacitor structure advantageously may use regions which cannot be used for the MOS structures.

If, in the off-state case, the field plate can be at a potential that lies between the potential of the drain zone and the potential of the source zone, the capacitance of the plate capacitor structure may have an effect only during the switching of the power semiconductor component. The rise in the drain-source voltage initially may take place rapidly and slows down toward the end of the switch-off operation. As a result, overall little time can be required for the turn-off, and the radiofrequency interference disturbances may nevertheless be reduced at the end of the switch-off operation.

In one embodiment, the second semiconductor regions may comprise a multiplicity of compensation pillars which project into the drift zone from above. The field plate can thus be connected to a compensation pillar. As a result, the field plate can be directly connected to a region which is at the potential of a compensation pillar and thus at the potential of that region of the drift zone which may surround the connected compensation pillar. In an advantageous manner, no additional circuitry outlay can be required outside the power semiconductor component for this purpose. Moreover, the first field plate can be connected with low resistance in comparison with an external connection. As a result, the plate capacitor structure rapidly may become effective if the power semiconductor component is switched.

If the compensation pillar connected to the field plate is situated in the center of the compensation pillars, then in the off-state case, the field plate can be at a potential whose value lies in the middle between the source potential and the drain potential. A compensation pillar may lie in the center if further compensation pillars are situated both between the compensation pillar and the edge and between the compensation pillar and the MOS structures.

In a further embodiment, field rings can be situated at the edge. In this case, the field plate can be connected to one of the field rings at the edge. The first capacitor plate can be preferably connected to a central one of the field rings. As a result, in the off-state case, it can be at a middle potential between source potential and drain potential and thus only may become effective if the drain-source voltage has already fallen below or exceeded a certain threshold.

In a further embodiment, an upper conductive layer can be provided above the field plate. Said layer can be insulated from the field plate by means of an insulation layer and can be electrically connected to the edge plate. The capacitance of the plate capacitor structure can be increased by virtue of this additional layer. Given the same thickness and the same material of the insulation layers above and below the upper capacitor plate, the capacitance can be doubled in comparison with a plate capacitor structure without an upper conductive layer.

If the upper conductive layer comprises metal or metal alloys, the resistance of the upper conductive layer can be low. As a result, the time constant of the plate capacitor structure can be advantageously reduced.

In a further embodiment, the field plate may comprise doped polysilicon. This may have the advantage that in the fabrication of the power semiconductor component, the field plate may be produced at the same time as the gates and by means of the same process steps. This may reduce the fabrication complexity.

The edge plate preferably may comprise semiconductor material of the first conductivity type. As a result, it can be directly connected to the drain zone, which is likewise of the first conductivity type.

If the power semiconductor component contains a plurality of plate capacitor structures lying one beside another, it is possible to achieve a large capacitance of the capacitor structure without the electrical resistance within the field plates and edge plates slowing down the switching of the capacitor structures.

BRIEF DESCRIPTION OF THE DRAWINGS

The invention is illustrated in greater detail on the basis of exemplary embodiments in the drawings.

FIG. 1 compares conventional and desired profiles of output capacitances of power semiconductor components.

FIG. 2 shows the switch-off behavior of a power semiconductor component with a conventional output capacitance profile.

FIG. 3 shows the switch-off behavior of a power semiconductor component with a desired output capacitance profile.

DETAILED DESCRIPTION

The actual and desired profiles of output capacitances of power semiconductor components are compared in FIG. 1. The area capacitance of a power semiconductor component is plotted against the drain-source voltage. The dashed line shows the profile of a conventional power semiconductor component. It remains constant at the value $C_1$ over the entire range of the drain-source voltage.

The desired profile of a drain-source capacitance is depicted as a solid line having a "trough profile". At low voltages it is at a value $C_2$, then falls to the lower value $C_1$ and remains at this value $C_1$ before rising to the value $C_2$ again at higher drain-source voltages.

FIG. 2 shows the switch-off behavior of a power semiconductor component with a conventional output capacitance profile. A transistor is involved here. The drain-source voltage $U_{DS}$ and the drain-source current $I_{DS}$ are plotted against time. When the transistor is switched off, the drain voltage initially rises slowly before rising steeply within a short time of approximately 10 ns until it has reached the final value of the drain-source voltage.

The switch-off behavior of a power semiconductor component with a desired output capacitance profile emerges from FIG. 3. For this an external capacitance of 2 nF was connected upon reaching a drain-source voltage corresponding approximately to two thirds of the output value of the drain-source voltage. A "trough profile" of the output capacitance is brought about as a result. The rise in the drain voltage takes place in a manner similar to that in FIG. 2, but the rise is retarded starting from a voltage of two thirds of the final value of the drain-source voltage. The voltage thereupon still needs approximately 20 ns until it has reached its final value.

Figure 4:
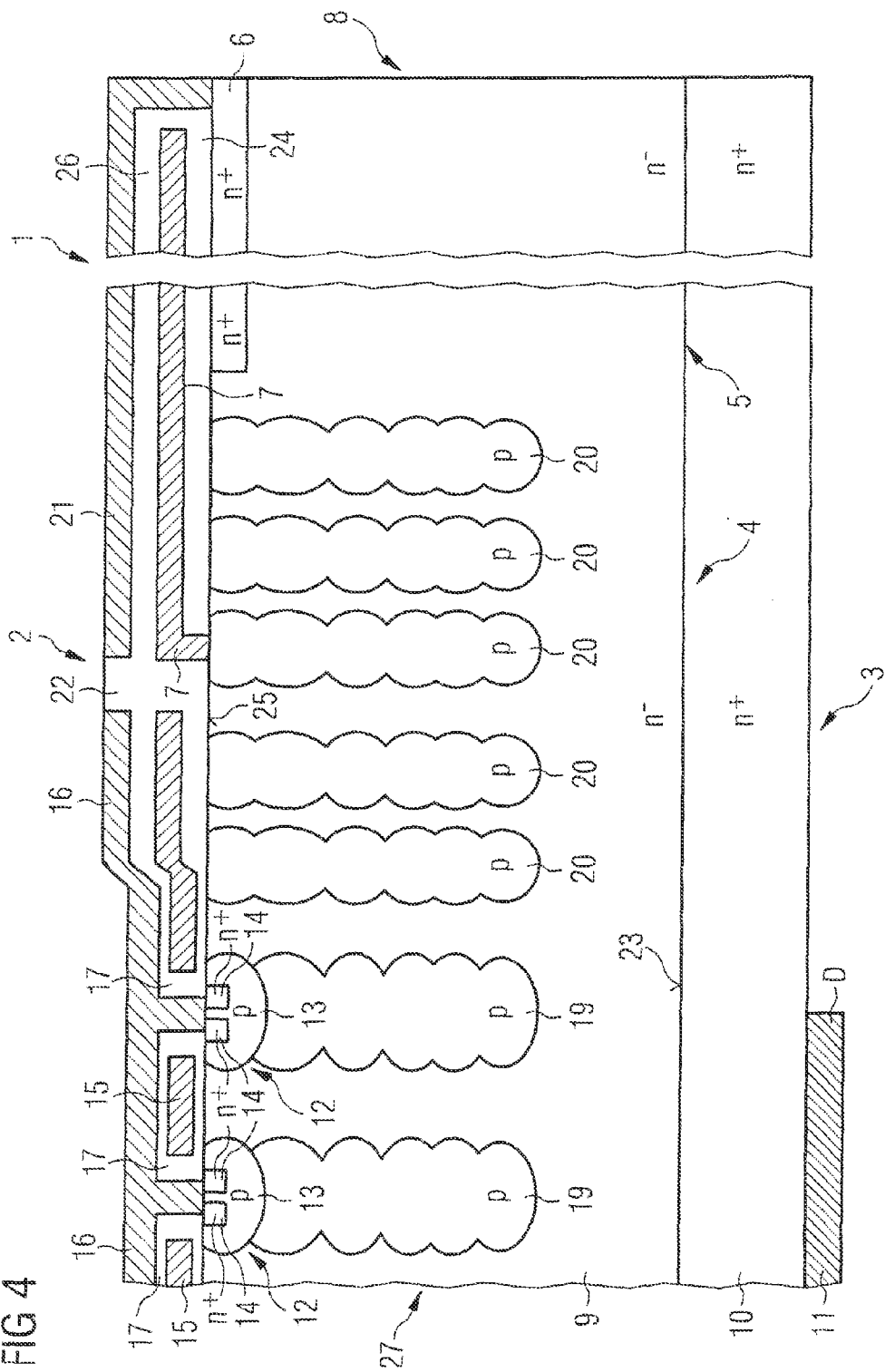
FIG. 4 schematically shows a cross section through a vertical power semiconductor component according to an embodiment with an increased output capacitance.

A section through a power semiconductor component 1 according to an embodiment is shown schematically in FIG. 4. The semiconductor component is formed as a vertical superjunction MOS transistor. The semiconductor component 1 has a front side 2 and a rear side 3, the front side 2 being situated at the top and the rear side 3 being situated at the bottom. The semiconductor structures which form the transistor are shown on the left. An edge termination 4 is provided on the right of the semiconductor structures, and an outer region 5 and an edge 8 are joined on the right of the edge termination 4.

A drift zone 9 made of weakly n-doped semiconductor material is situated in the semiconductor structures which form the transistor. A drain zone 10 comprising highly doped $n^+$-type semiconductor material with a metallic drain electrode 11 is situated below said drift zone 9. MOS structures 12 comprising p-doped body zones 13, $n^+$-doped source zones 14 and gates 15 are introduced above the drift zone 9. The body zones and the source zones 14 are connected to the source electrode 16.

The gates 15 comprise doped polysilicon and are isolated from the source electrode 16 and from the semiconductor regions of the drift zone 9, the body zone 13 and the source zone 14 by means of the gate insulation 17, which comprises silicon oxide. The gates 15 are interconnected by means of a common gate electrode, which is not shown here. Compensation pillars 19 made of p-doped material extend below the body zones 13.

If a voltage is applied to the gate electrode such that the voltage between source and gate 15 exceeds a threshold value, this may have the effect that conductive channels 18 form in the body zones 13 between the source zones and the drift zone 9. This results in a current flow from the source regions 14 to the drain region 10.

The structure described forms a power MOS transistor. As soon as a threshold value is undershot for the voltage at the gates 15 in the off-state case, there is no longer a channel 18 between the drift zone 9 and the source zones 14. However, a high voltage is present between the drift zone 9 and the other semiconductor regions. In order to prevent an avalanche breakdown from occurring, the drift zone 9 is lightly doped. In addition, the compensation pillars 19 ensure that compensating opposite charges are made available to the free charges in the drift zone 9, said free charges being determined by the magnitude of the n-type doping. The compensation pillars 19 form together with the n-doped regions of the drift zone 9 that surround them a so-called superjunction structure.

The edge termination 4 comprises a plurality of p-doped pillars in the drift zone 9, which are electrically insulated from one another and which are referred to as edge termination pillars 20. The upper termination of the edge termination pillars 20 lies on the upper edge 25 of the semiconductor body 27. The edge termination pillars 20 project into the drift zone 9, but they do not reach as far as the lower edge 23 of the drift zone 9. They may, however, also project into the drift zone 9 to an extent such that their lower end lies on the lower edge 23 of the drift zone 9. The edge termination pillars 20 provide for a reduction of the voltage from the drift zone 9 at drain potential to the regions of the MOS structure 12.

An edge plate 6 made of heavily n-doped material is situated above the drift zone 9 between the edge termination pillars 20 and the edge 8. Furthermore, a layer sequence comprising an insulation layer 24, a field plate 7, an insulation layer 26 and an upper conductive layer 21 is situated above the edge plate 6. The field plate 7 is connected to one of the edge termination pillars 20 of the edge termination 4. The field plate does not quite reach as far as the edge 8, but rather terminates beforehand and is covered laterally by the insulation layer 24. Consequently, the upper conductive layer 21 extends, at the edge 8, down onto the edge plate 6, with which it forms an electrical contact. In this case, the insulation layer 24 is made thicker than the gate oxide lying below the gates 15.

The field plate 7 is connected to a central edge termination pillar 20. As a result, in the off-state case, the field plate 7 is at a potential that lies approximately in the middle between the drain potential and the source potential.

The upper conductive layer 21 is isolated from the source electrode 16 by an insulation region 22.

In this case, the field plate 7 forms a first plate of a plate capacitor structure, the other plate of which is formed by the edge plate 6 and the upper conductive layer 21.

The required area for this plate capacitor structure which is formed by the field plate 7 and edge plate 6 can be calculated as follows. Given an active area of a vertical power semiconductor component 1 of 21 mm$^2$ and a total area of approximately 26 mm$^2$, the output capacitance is approximately 5 nF as soon as voltages of a few volts are present at the output. The intention is for the capacitance made available by the field plate 7 to be of the same order of magnitude. If the insulation layer 24 essentially contains silicon dioxide and is 1 μm thick, an area of 14 mm$^2$ may be required. If the plate capacitor is realized toward the top and toward the bottom, the area requirement can be reduced to 7 mm$^2$.

Therefore, the total chip area rises by less than 30%, especially as hitherto unused area portions are used for the capacitor structure. Since the ultimately annularly embodied capacitor structure may require only one additional phototechnology, the process costs are not increased significantly. Consequently, the additional costs for the provision of the capacitor structure are likewise estimated to be lower than 30% of the costs for the power semiconductor component.

In order to achieve an area for the plate capacitor of 7 mm$^2$, a capacitance ring having a width of approximately 0.4 mm may be required given a chip extent of 18 mm (active area). Such a ring may have a resistance of 0.22 ohm, assuming a typical poly resistance of 10 ohm/sq in the case of superjunction transistors. Consequently, the capacitor may have time constants of at most 1 ns, which suffices in the case of the given rise times.

Figure 5:
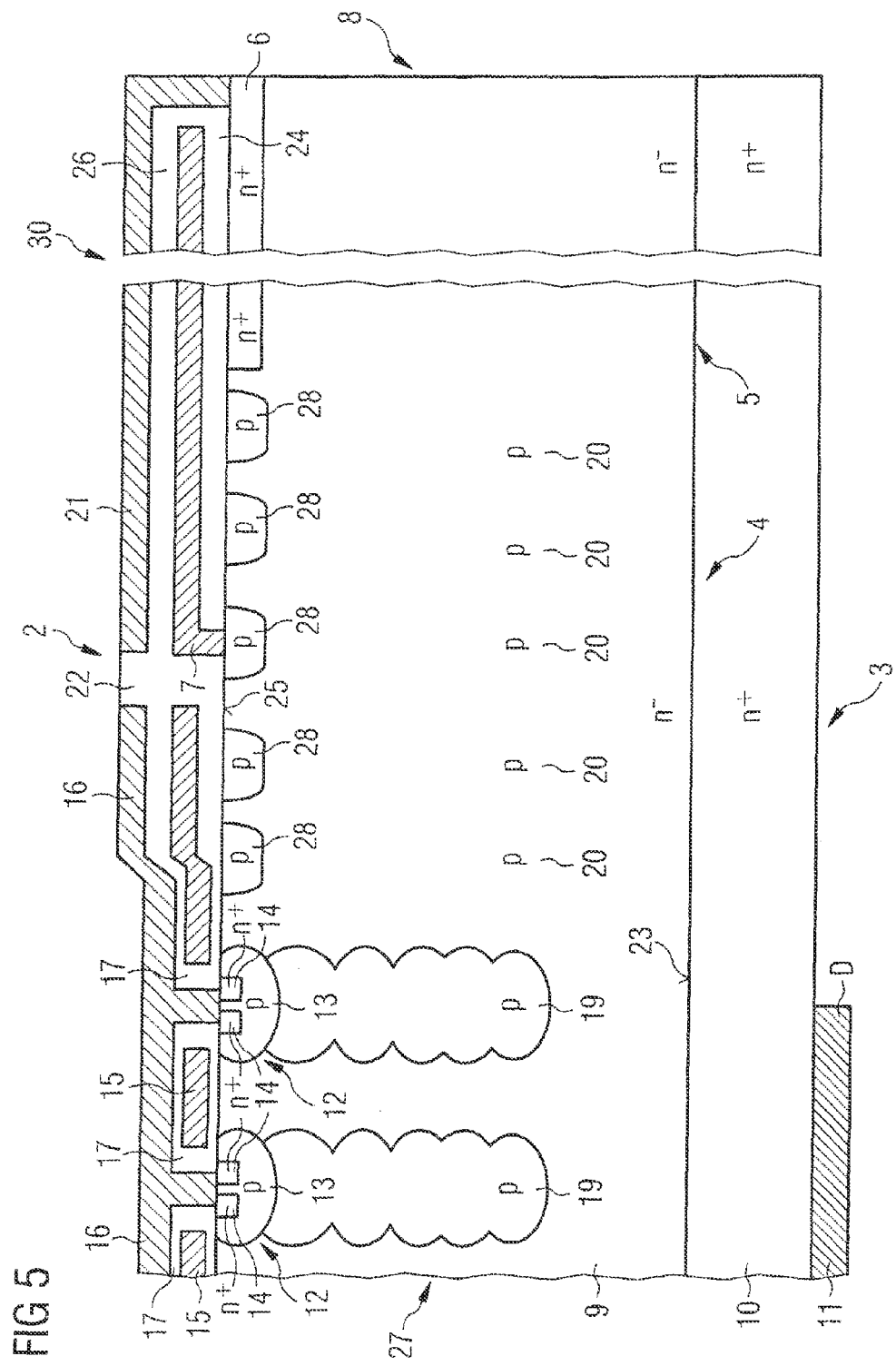
FIG. 5 shows a further embodiment of a vertical power semiconductor component according to an embodiment with an increased output capacitance.

FIG. 5 illustrates a further embodiment of the semiconductor component according to an embodiment, said component being illustrated schematically in section. FIG. 5 differs from FIG. 4 with regard to the edge termination. Structural parts having functions identical to those in the previous figures are identified by the same reference symbols and are not discussed separately. The edge termination 4 contains field rings 28 of the second conductivity type, the top side of which lies on the upper edge 25 of the semiconductor body 27. The field rings enclose MOS structures and protect the MOS structures against the high potentials that prevail in the semiconductor regions at the edge 8 of the semiconductor body 27. In the off-state case, regions in the field rings and in the regions of the drift zones that surround them are depleted, that is to say that the number of free charge carriers is greatly reduced. In this case, the doping concentration of the field rings 28 dictates the size of the region within the field rings 28 which is depleted, and the size of the depleted region of the drift zone 9 in the vicinity of the field rings 28.

The field plate 7 is connected to a central field ring 28, so that, in the off-state case, the field plate 7 is at a potential that lies approximately in the middle between drain potential and source potential.

Figure 6:
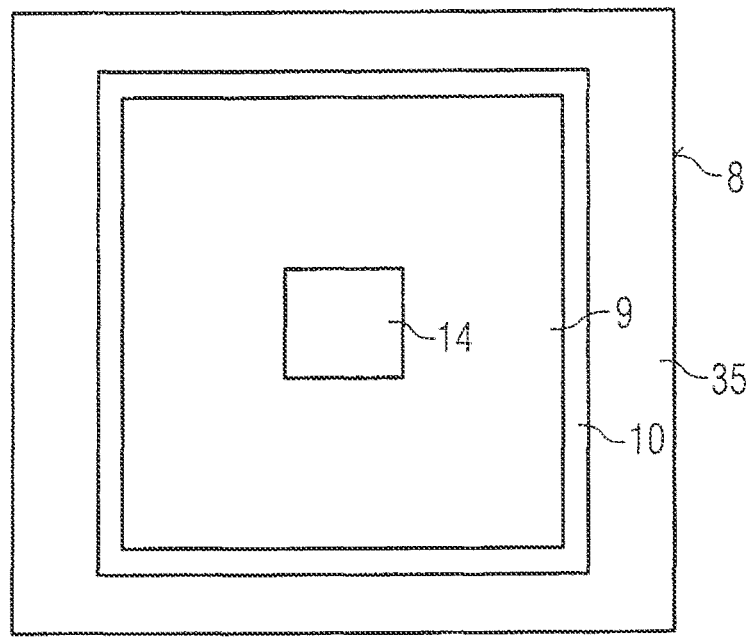
FIG. 6 schematically shows a lateral power semiconductor component according to an embodiment in plan view.

A lateral power semiconductor component is shown in plan view in FIG. 6. It contains an edge 8, a drain zone 10, a drift zone 9 and a source zone 14. The source zone 14 lies in the center of the semiconductor component and is enclosed by the drift zone 9 and the drain zone 10. A capacitance region 39 is provided between the edge 8 and the drain zone.

Figure 7:
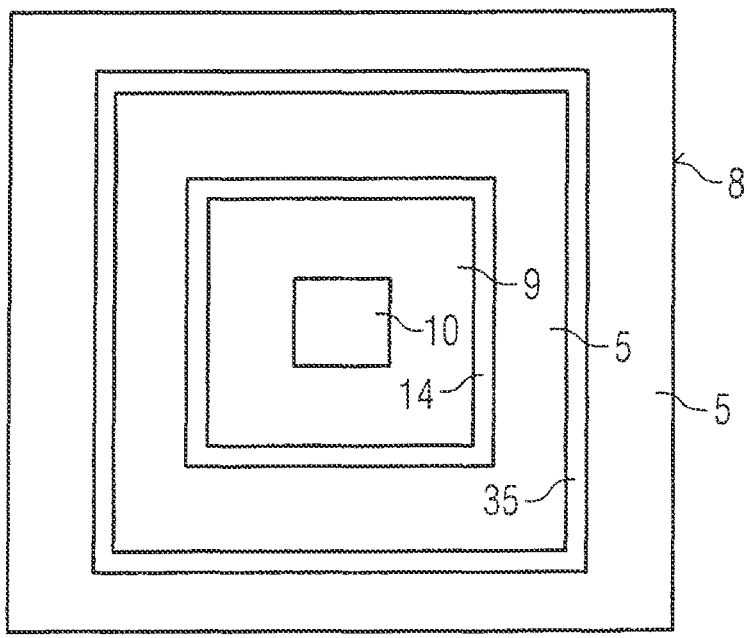
FIG. 7 shows the schematic plan view of a lateral power semiconductor component in a further embodiment.

FIG. 7 shows a further exemplary embodiment of a lateral power semiconductor component in plan view. The vertical power semiconductor component is delimited by an edge 8. A capacitance region 39 is situated in the outer region 5. A source region 14, a drift path 9 and a drain zone 10 are provided in the inner region. In contrast to the exemplary embodiment in FIG. 6, here the drain zone 10 is situated innerly and the source zone 14 is situated outwardly.

Figure 8:
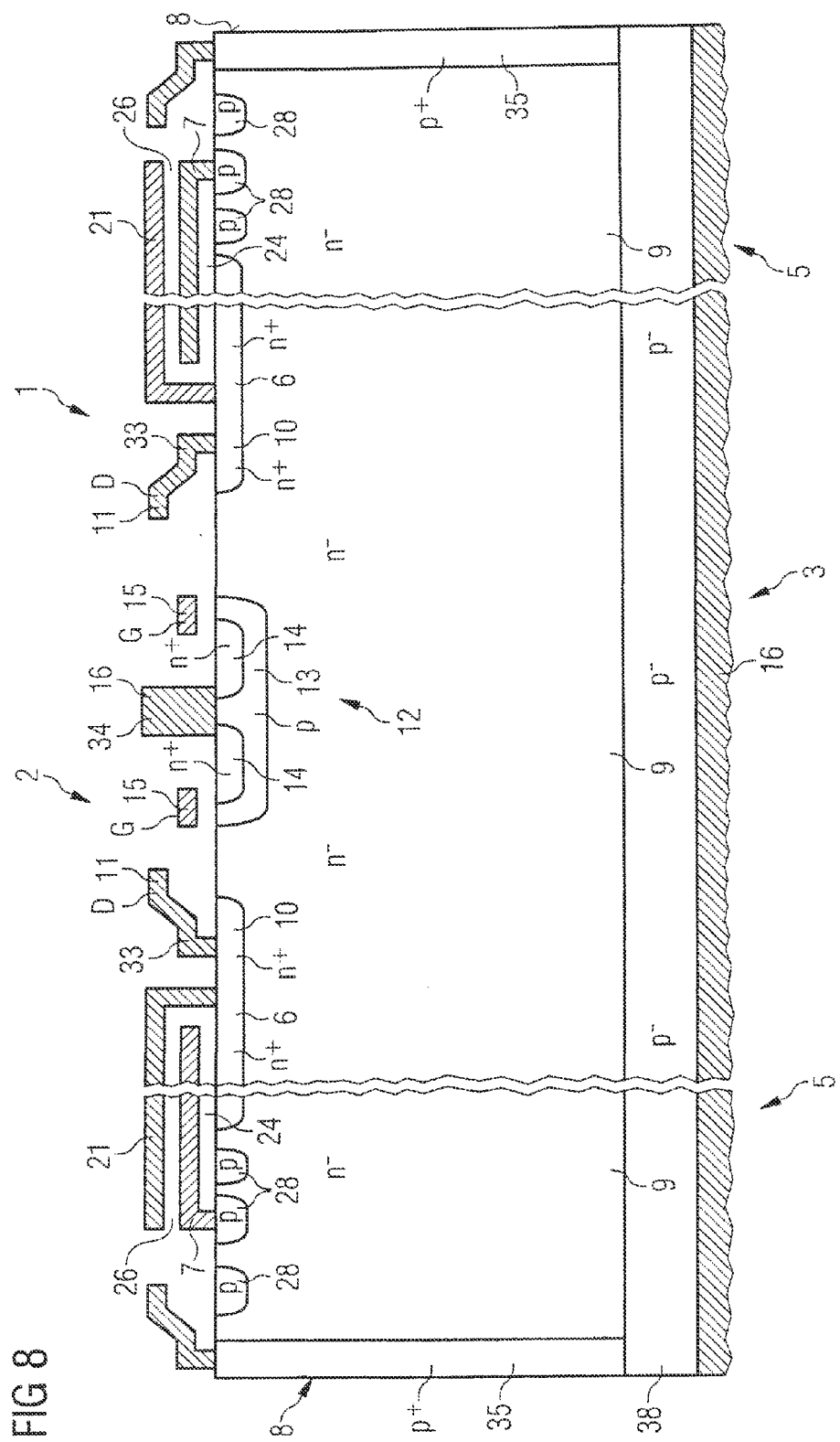
FIG. 8 schematically shows the cross section through a lateral power semiconductor component according to an embodiment.

FIG. 8 schematically shows a vertical power semiconductor component according to an embodiment in cross section. It contains an outer region 5 on the left, a region with a MOS structure 11 in the middle, and a further outer region 5 on the right. The front side 2 is shown at the top and the rear side 3 is shown at the bottom. The drift zone 9 extends from the front side 2 of the lateral power semiconductor component 1 as far as a rear-side source region 38. The drift zone 9 is of the first conductivity type and weakly doped and the rear-side source zone 38 is of the second conductivity type. The MOS structure 11 contains drain zones 10 of the first conductivity type, source zones 14 of the second conductivity type, a body zone 13 of the second conductivity type, and also a gate 15 isolated from the semiconductor regions. The gate 15 provides for a current flow from the source zones 14 through the body zone 13 and the drift zone 9 to the drain zones 10.

The drain zones 10 are connected via the drain contact 33 and the drain electrodes 11. The source zones 14 are connected via the source contact 34 and source electrodes 16.

Plate capacitor structures each having a field plate 7, an insulation layer 24, an edge plate 6 are situated in the outer regions 5. Such plate capacitor structures are provided for example in a capacitance region 39 as shown in FIG. 6 or 7. The edge plate 6 comprises highly doped semiconductor material which is directly connected to the drain zone 10. The field plate 7 made of doped polysilicon extends horizontally above the edge plate 6 and is insulated from the edge plate 6 by means of the insulation region 24.

The field plate 7 is connected to the central one of the three field rings 28. An insulation layer 26 and also the upper conductive layer 21 lie above the field plate 7. The upper conductive layer 21 increases the capacitance between edge plate 6 and field plate 7.

In addition, a perpendicularly extending edge pillar 35 of the second conductivity type is situated at the edge 8, said edge pillar being in electrical contact with the rear-side source zone 38.

In the case of the exemplary embodiment shown here, the edge plate is situated between the MOS structure 12 and the field rings 28. In contrast to this, in the vertical power semiconductor component according to FIG. 5, the edge plate is provided between the field rings 28 and the edge 8.

Figure 9:
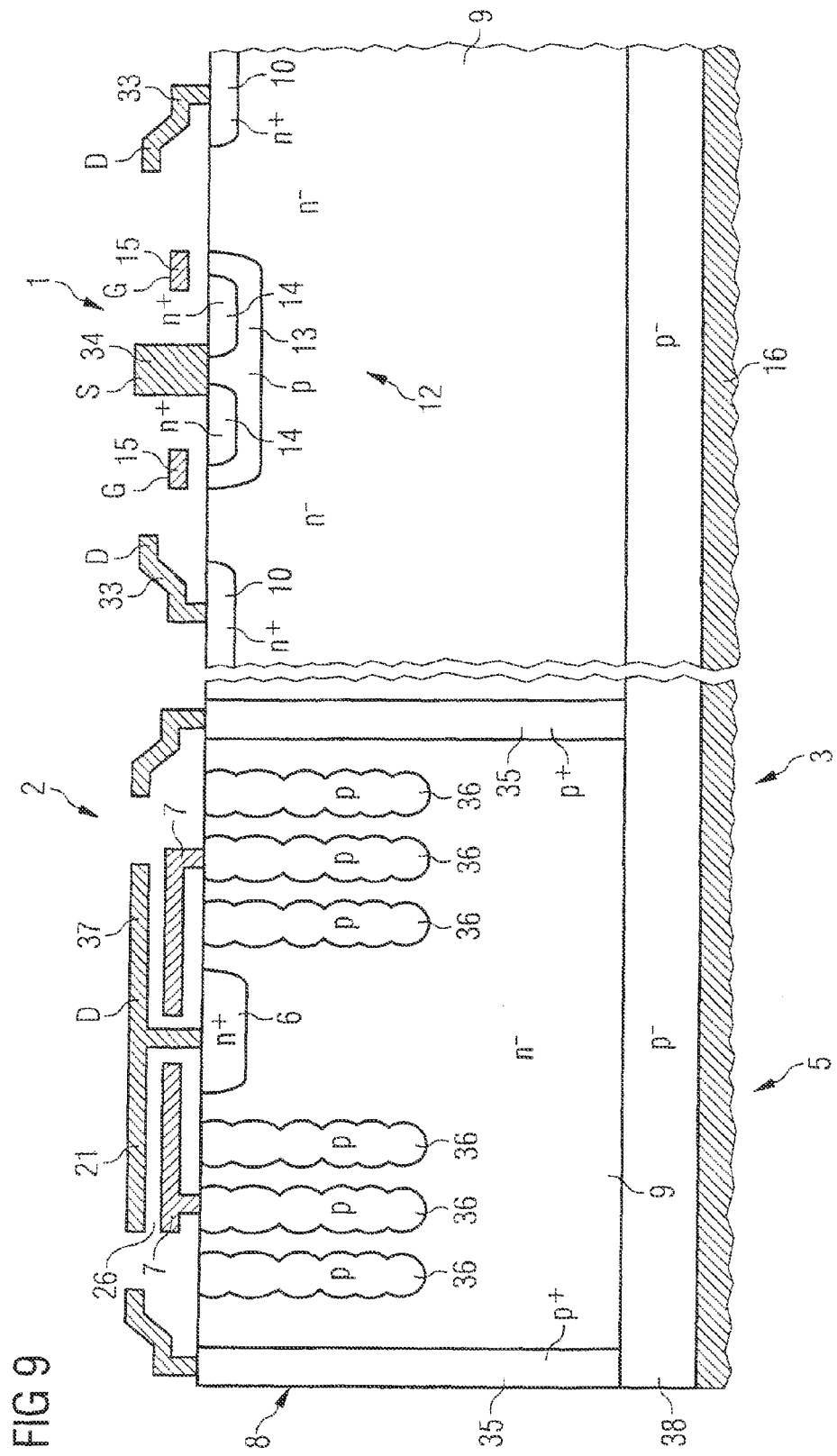
FIG. 9 shows a further exemplary embodiment of a lateral power semiconductor component in cross section.

FIG. 9 shows a further exemplary embodiment of a lateral power semiconductor component 1 according to an embodiment in cross section. In this case, two plate capacitor structures each comprising a field plate 7 and edge plate 8 are provided one beside the other in an outer region 5. In this case, the edge plates 6 of the two adjacent plate capacitor structures are connected to one another and brought to the drain potential by means of a metallic connection (not shown in FIG. 9).

In embodiments that are not shown here, further plate capacitor structures and/or further MOS structures are provided between the outer region 5 and the MOS structure 11.

Figure 10:
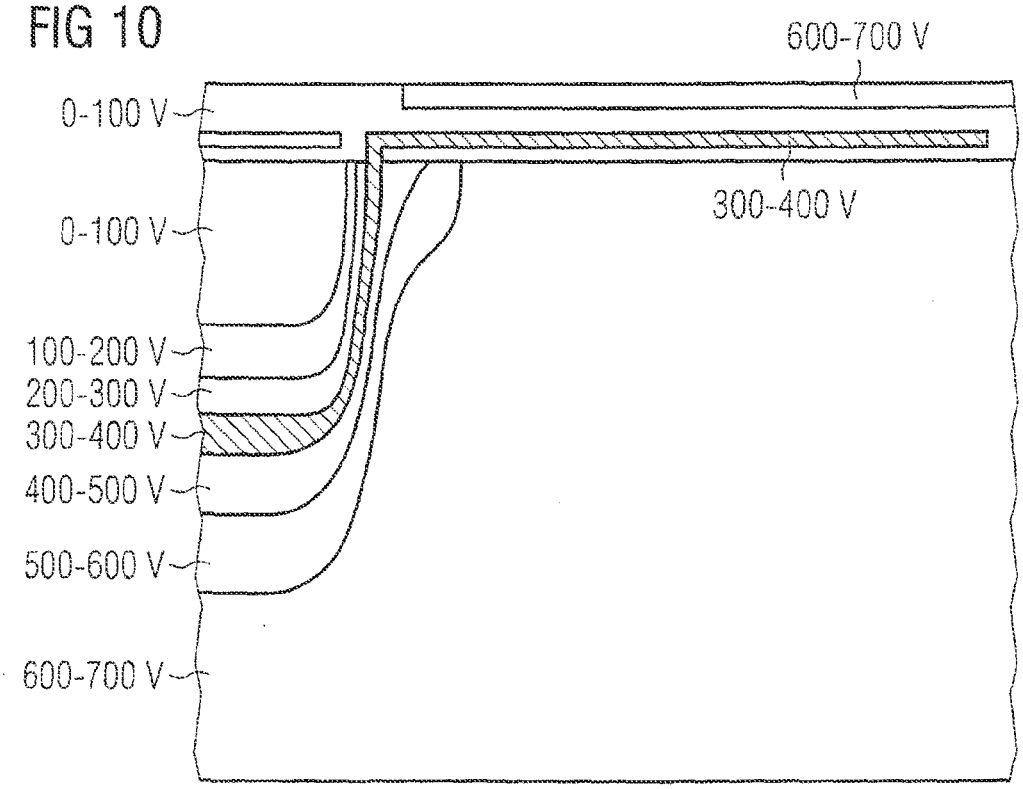
FIG. 10 shows the potential profile of a power semiconductor component according to an embodiment.

FIG. 10 shows the potential profile of a vertical power semiconductor component according to an embodiment. The regions are designated with the potentials that they have in the off-state case.

The potential profiles for MOS structures 12 with an edge termination 4 are situated on the left-hand side. The voltage reduction takes place from the drain, which is at a potential of 700 V, to the source zones 14, which have a potential of 0 V. Situated in the right-hand region is a field plate 7 made of polysilicon, which is situated between an edge plate 6 and an upper conductive layer 21. The field plate 7 is connected via a field ring 28 which is at 300 V to 400 V. Consequently, the field plate 7 is also at the potential of 300 V to 400 V. The region above the field plate 7 is at 600 V to 700 V. Below the field plate 7, a potential of 600 V to 700 V prevails in the regions which lie under the edge plate 6, while the field rings 28 which lie below the field plate 7 and are not connected to said field plate 7 are at lower potentials than the drain potential.

Figure 11:
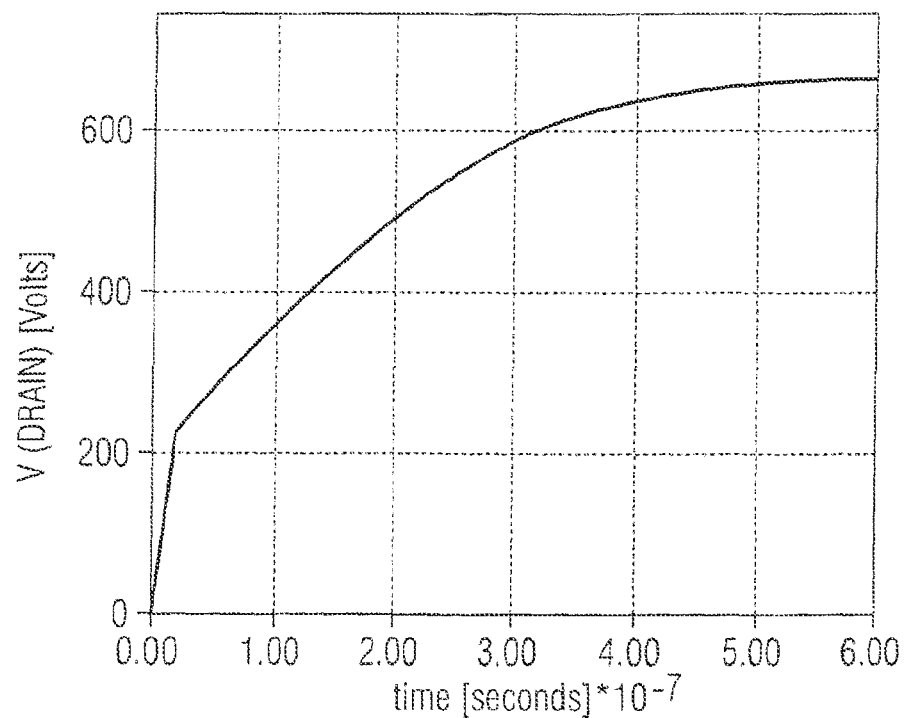
FIG. 11 illustrates the profile of the drain voltage when switching off a power semiconductor component according to an embodiment.

The behavior of the drain voltage when switching off a vertical power semiconductor component according to an embodiment is illustrated in FIG. 11. The drain voltage is plotted against time, a constant current being assumed. The drain voltage rises rapidly up to approximately 250 V, whereas the rise is retarded afterward. Consequently, the output capacitance is greater at higher drain voltages that at low drain voltages. The effective capacitance calculated from the voltage rise and the charging current essentially corresponds to the capacitance between the field plate 7 and the drain.

What is claimed is:

1. A lateral power semiconductor component comprising:
   a front side;
   a rear side;
   a lateral edge;
   an inner region with a MOS structure;
   an outer region interposed between the inner region and the lateral edge;
   a drift zone of a first conductivity type extending from the inner region into the outer region;
   a source zone of the first conductivity type disposed in the inner region;
   a body zone of a second conductivity type opposite the first conductivity type disposed in the inner region;
   a drain zone of the first conductivity type disposed in the inner region;
   a gate which forms the MOS structure with the drift zone, the source zone and the body zone; and
   a first horizontally extending field plate disposed above each semiconductor region of the power semiconductor component in the outer region, the first field plate forming a first plate capacitor structure with a first edge plate disposed under the first field plate in the outer region,
   wherein the first edge plate is a highly doped semiconductor material spaced apart from the drain zone and electrically connected to one of a source potential and a drain potential of the power semiconductor component.

2. The lateral power semiconductor component as claimed in claim 1, wherein in an off-state case, the first field plate is at a potential that lies between the drain potential and the source potential.

3. The lateral power semiconductor component as claimed in claim 1, further comprising a plurality of compensation pillars at the lateral edge, wherein the field plate is connected to one of the compensation pillars at the lateral edge.

4. The lateral power semiconductor component as claimed in claim 3, wherein the compensation pillar to which the field plate is connected is disposed in a center of the compensation pillars.

5. The lateral power semiconductor component as claimed in claim 1, further comprising a plurality of field rings at in the outer region adjacent the lateral edge, wherein the first field plate is connected to one of the field rings at the lateral edge.

6. The lateral power semiconductor component as claimed in claim 5, wherein the field ring to which the first field plate is connected is disposed in a center of the field rings.

7. The lateral power semiconductor component as claimed in claim 1, further comprising an upper conductive layer electrically connected to the first edge plate and disposed above the first field plate, wherein the first field plate is insulated from the upper conductive layer by an insulation layer between the first field plate and the upper conductive layer.

8. The lateral power semiconductor component as claimed in claim 7, wherein the upper conductive layer comprises a metal or a metal alloy.

9. The lateral power semiconductor component as claimed in claim 1, wherein the first field plate comprises doped polysilicon.

10. The lateral power semiconductor component as claimed in claim 1, wherein the first edge plate is of the first conductivity type.

11. The lateral power semiconductor component as claimed in claim 1, further comprising a plurality of plate capacitor structures disposed one beside another and each including at least one field plate and an edge plate.

12. The lateral power semiconductor component as claimed in claim 1, further comprising a second plate capacitor structure disposed in the outer region between the first plate capacitor structure and the inner region or between the lateral edge and the first plate capacitor structure, the second plate capacitor structure comprising a second field plate and a second edge plate, the second field plate horizontally extending over part of the second edge plate, the second edge plate is a highly doped semiconductor region.

13. The lateral power semiconductor component as claimed in claim 12, wherein the first and second edge plates are connected to one another.

14. The lateral power semiconductor component as claimed in claim 13, further comprising an upper conductive layer electrically connected to the first and second edge plates and having a first region above the first field plate which extends horizontally toward the lateral edge and a second region disposed above the second field plate which extends horizontally toward the drain zone, wherein the first and second field plates are insulated from the upper conductive layer by an insulation layer.

15. The lateral power semiconductor component as claimed in claim 12, wherein the first field plate horizontally extends to over the first edge plate in a direction oriented toward the drain zone, and wherein the second field plate horizontally extends to over the second edge plate in a direction oriented toward the lateral edge.

* * * * *

UNITED STATES PATENT AND TRADEMARK OFFICE
CERTIFICATE OF CORRECTION

| | | |
|---|---|---|
| PATENT NO. | : 8,754,468 B2 | Page 1 of 1 |
| APPLICATION NO. | : 12/962791 | |
| DATED | : June 17, 2014 | |
| INVENTOR(S) | : U. Wahl et al. | |

It is certified that error appears in the above-identified patent and that said Letters Patent is hereby corrected as shown below:

In the Claims

Column 12, line 65 (claim 5, line 2) change "field rings at in the" to -- field rings in the --

Signed and Sealed this
Sixth Day of January, 2015

Michelle K. Lee
*Deputy Director of the United States Patent and Trademark Office*